United States Patent [19]

Cornellier

[11] Patent Number: 4,799,450
[45] Date of Patent: Jan. 24, 1989

[54] TINNING SYSTEM FOR SURFACE MOUNT COMPONENTS

[75] Inventor: J. Rene Cornellier, St. Julie, Canada

[73] Assignee: Corfin Technologies Inc., Chambly, Canada

[21] Appl. No.: 30,568

[22] Filed: Mar. 27, 1987

[51] Int. Cl.4 ............................................. B05C 11/00
[52] U.S. Cl. ...................................... 118/63; 118/50; 118/74; 118/410
[58] Field of Search ................ 427/312, 327; 118/500, 118/50, 14, 74, 410, 63; 198/471.1

[56] References Cited

U.S. PATENT DOCUMENTS

| | | | |
|---|---|---|---|
| 3,302,803 | 2/1967 | Mooney | 198/471.1 |
| 3,587,816 | 6/1971 | Russell et al. | 198/471.1 |
| 3,633,731 | 1/1972 | Jones | 198/471.1 |
| 4,570,569 | 2/1986 | Kondo | 118/500 |

Primary Examiner—Thurman K. Page
Assistant Examiner—L. R. Horne
Attorney, Agent, or Firm—Watson, Cole, Grindle & Watson

[57] ABSTRACT

A method and apparatus for the tinning or hot solder coating of leads of electronic components wherein the components are individually transported through the tinning process by means of a vacuum gripping device and wherein the planarity and thickness of the solder coating is controlled using pressurized gaseous material.

10 Claims, 4 Drawing Sheets

TINNING SYSTEM FOR SURFACE MOUNT COMPONENTS

BACKGROUND OF THE INVENTION

1. Field of the Invention

The present invention relates to a method and apparatus for tinning electronic components.

2. The Prior Art

The tinning of electronic components comprises the step of applying a hot solder coating to metallic leads or contact points of the component package. This tinning of components prior to placement on the circuit board is known in the art and is considered necessary to providing high quality and reliable connections. In the normal manufacturing cycle, a component may be stored for a substantial period of time before being utilized. During this storage period, leads can become oxidized or otherwise subject to deleterious conditions, such that when the component is later placed on the circuit board and the board assembly then soldered (normally through an automated soldering system), an oxidized lead may not solder properly thus leading to a board fault or defect. Accordingly, many manufacturers have found it advisable to solder coat the leads of the components prior to use of the component, such that when the component is later placed on the printed circuit board, the solder "reflows" and a good solder connection is assured.

To date, many different types of systems have been used for tinning the components. These range from fully automated in-line systems such as illustrated in U.S. Pat. No. 4,654,227 wherein a component is grasped by mechanical means and carried through the required processing steps, to smaller systems wherein the components are inserted into some type of tooling or fixturing and then subsequently processed. Much of the above depends upon the type of component to be tinned. Because of the problem of handling many different types of components, a large manual operation is widely used in the industry.

One particular problem encountered in the art relates to surface mounted components. With the increasing requirement for miniaturization, the industry has moved towards a surface mount configuration wherein the components are mounted on the surface of the board rather than having the leads pass through the board. Also, due to miniaturization, these surface mounted ICs generally have leads spaced closer together than is the case with through the board technology and the tinning of the leads becomes even more important. Typical of such surface mount components are those known as LCCs (leadless chip carriers) or PLCCs (plastic leaded chip carriers). In the case of LCCs, only small contact points are provided on the bottom of the IC package, while in the case of PLCCs, either a gullwing or J-lead is formed, often with a spacing of 25 mils or less between leads. These components frequently have leads extending from all four sides of a small rectangular body, thus creating problems for mechanical grasping of the component. In the past, in order to tin these components, it has been required to process one side of the component and then the opposite side.

A further problem encountered with the tinning of such types of components and particularly leadless chip carriers is to obtain an even coating on the leads or contact points (as used herein the term leads applies to all electrical contact points where the component is soldered to the board or substrate). In this respect, a conventional tinning process, either through dipping the component in a static solder pot or passing it through a wave, frequently leaves large differences in the solder thickness on the leads. Thus, for example, one lead may have a 2 mil coating while another one on the same package may have a 10 mil coating. When the component is subsequently placed on the board and passed through a conventional soldering process, good soldering connections between the lead and board are not obtained. Also, when done either manually or by automated equipment, it has been found that reproducibility of the result has not been good.

SUMMARY OF THE INVENTION

It is therefore an object of the present invention to provide an apparatus suitable for tinning electronic components and particularly surface mount components wherein all leads of the component can be tinned in a single pass.

It is a further object of the present invention to provide an apparatus suitable for the tinning of electronic components and particularly surface mount components wherein planarity and reproducibility of the tinning can be easily achieved It is a further object of the present invention to provide a method for the tinning of electronic components and particularly surface mount components wherein the thickness of the coating can be controlled.

In one aspect of the present invention, there is provided a tinning system for tinning electronic components, the system comprising an endless closed-loop conveyor having an input position and an output position with a plurality of processing stations intermediate the input position and the output position. The conveyor has a plurality of vacuum gripping devices mounted thereon. Each vacuum gripping device is adapted to grip a component at the input station when a vacuum is established in the device at this input portion and the device is held by the vacuum which is "locked-in" while the component is carried through the various processing stations. At the output station, automated means are preferably provided for releasing the vacuum from the vacuum gripping device and the device is deposited on a transfer means to be carried away from the output station. At the input station, automated means are preferably provided for bringing the individual components into operative relationship with each of the vacuum gripping devices.

In another aspect of the invention, in a tinning system which includes means for transporting electronic components through a plurality of processing stations for tinning the leads of the components, and wherein the components are retained by a device and passed through a fluxing station and a solder wave for applying a layer of molten solder to tinnable surfaces, there is provided the improvement of means for blowing hot gaseous material through a slot directed at the tinned leads while the solder is still molten to maintain a planar coating on the tinned leads.

In greater detail, a typical tinning system includes an endless loop conveyor having a plurality of gripping devices mounted thereon. The gripping devices are intended to retain components such as ICs or any other tinnable package and carry them through a plurality of processing stations. Typically, such processing stations will include a fluxing station (which may be of the wave or foam type), a preheat station wherein the leads are heated to dry the flux; a solder station wherein the leads are passed through molten solder to tin the surfaces; and a cleaning station wherein any remaining flux is washed off along with any other contaminants. It will be understood that other processing stations may be added or deleted as desired; for example, a pre-clean or acid-etch station may be included and it is also known in the art to utilize other processing steps such as multiple solder application.

At the input station or position of the conveyor, there is preferably provided a singulator for taking individual components from a source of the same and bringing the individual components into operative relationship with the gripping device. In conjunction with the singulator, there may be provided a loading system for bringing containers of components into the singulator; the particular type of loading device will depend upon the format in which the components are presented. Frequently, tubes are utilized for many ICs and in this format, a high degree of automation may be incorporated into the loader for sequentially bringing tubes into alignment with the singulator by means of a robotic arm or other suitable means.

In a preferred embodiment of the invention, the singulator is adapted to bring each component upward to present it to the tip of the vacuum gripping device whereby once the vacuum has been established, the part is securely held with the vacuum being "locked in".

Also in a preferred embodiment of the invention, there is provided a soldering station which utilizes a wave and immediately upon exit of the part from the wave of molten solder, a heated pressurized gaseous material is directed at the tinned bottom surface of the component to maintain a planar coating on the leads of the component. This heated gaseous material is directed so as to act as a "wiper" for the excess molten solder to thereby maintain the planarity of the coating. The gaseous material, for reasons of economy, will normally be air, although if desired, a different inert material may be utilized. Similarly, known additives may be added to the stream of gaseous material. The temperature of the gaseous material should be at least close to the melting point of the solder and preferably is between 350° F. and 400° F.

In one preferred aspect of the above, the heated gaseous material is provided by means of a tube extending in a serpentine through the solder pot such that the air is heated by the molten solder. A discharge slot directs the heated air at the leads immediately following exit of the leads from the solder wave.

In preferred embodiments of the invention, the directing of the hot pressurized gaseous material is closely controlled to achieve the desired results. For most surface mount components, the package has a rectangular configuration with planar top and bottom surfaces and the leads extending to the bottom (the leads may exit from the side of the package, but the contact points are generally on the bottom). The hot pressurized gaseous material is preferably directed at an angle of close to 90° with respect to the bottom surface of the package and may be inclined ±25° from the vertical position. The pressure at which the gaseous material exits the slot may be controlled to thereby control the thickness of the coating on the leads. For example, if a minimal coating is desired and an absolutely flat profile is to be achieved, the higher pressure will be utilized, while if a thicker coating is desired, a lower pressure is used. The application of the hot pressurized air occurs immediately following exit of the part from the molten solder wave before the solder solidifies on the leads. Generally, a pressure of between 3 and 10 psi has been found to be suitable in the practice of the present invention.

It has been found desirable to have a certain configuration to the nozzle from which the hot pressurized air is directed at the component. In particular, the exit slot normally has a very small width (in the order of 1/100") and the distance for which the walls of the nozzle are parallel is kept very small. Thus, typically the air will enter the nozzle portion and the walls will taper inwardly to the exit of the nozzle. At the exit, the walls are parallel for a very short distance to ensure a proper air flow and control of the tinning.

It has also been found desirable that the nozzle be located very close to the leads and in practice, a distance of between 1/16 to ¼" has been found to be suitable. The particular distance will depend on the lead configuration, size of the component, amount of control desired, etc.

Following discharge from the conveyor, the component may be placed on a means to transport the same to a desired location Preferably, the part is discharged on a transfer belt which will then take the part to a suitable apparatus for repackaging the component.

In one preferred embodiment of the invention, the conveyor carries a plurality of vacuum gripping devices, each vacuum gripping device having a body portion, a stem portion, one end of the stem having a flexible tip thereon which is adapted to engage a surface of the component to be grasped while the other end of the stem fits in the body portion. The body includes an inlet and an outlet port, the inlet port being located on a body surface while the outlet port is operatively associated with the end of the stem adapted to grasp the component. The inlet port is adapted to be aligned with means for creating a vacuum and there is a passageway between the inlet port and the outlet port. Mounted within the passageway is a spring actuated valve such that when the vacuum is applied to the inlet port, a suction is created at the outlet port and the component is grasped by the suction created. Subsequently, the means for creating the vacuum is removed from the inlet port and the spring actuated valve acts to seal the passageway to "lock in" and maintain a partial vacuum between the outlet port and the valve. The component is discharged when the valve member is operative to open the passageway between the inlet port and the outlet port. The particular vacuum creating means utilized can be chosen from those knowledgeable in the art. Thus, one may use a vacuum pump or alternatively, a Venturi effect may be utilized to create the vacuum in the passageway.

BRIEF DESCRIPTION OF THE DRAWINGS

Having thus generally described the invention, reference will be made to the accompanying drawings illustrating an embodiment thereof, in which.

DETAILED DESCRIPTION OF THE PREFERRED EMBODIMENT

Figure 1:
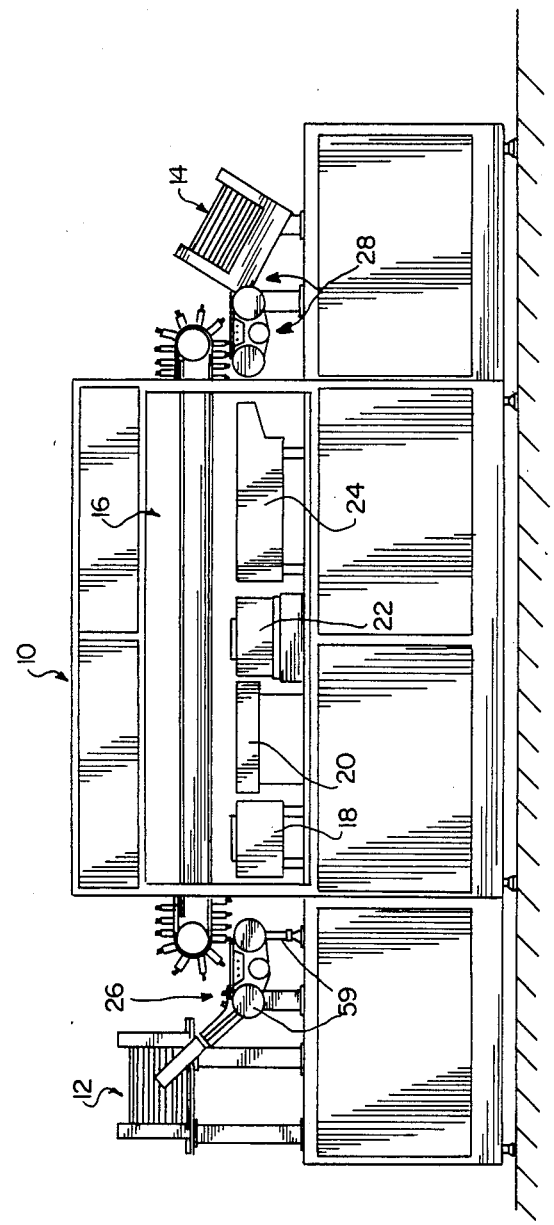
FIG. 1 is a front view of the tinning system.

Referring to the drawings in greater detail and by reference characters thereto, there is illustrated in FIG. 1 a tinning system which includes a loader 12 and an unloader 14. Intermediate loader 12 and unloader 14 is a processing module 10 including a conveyor generally designated by reference number 16. Conveyor 16 is a closed loop endless conveyor adapted to carry components through processing stations which, in the illustrated embodiment, include a fluxing station 18, a preheat station 20, a solder station 22 and a cleaning station 24. Reference numeral 26 designates an accumulator and singulator input station while reference numeral 28 designates an output station.

Figure 2:
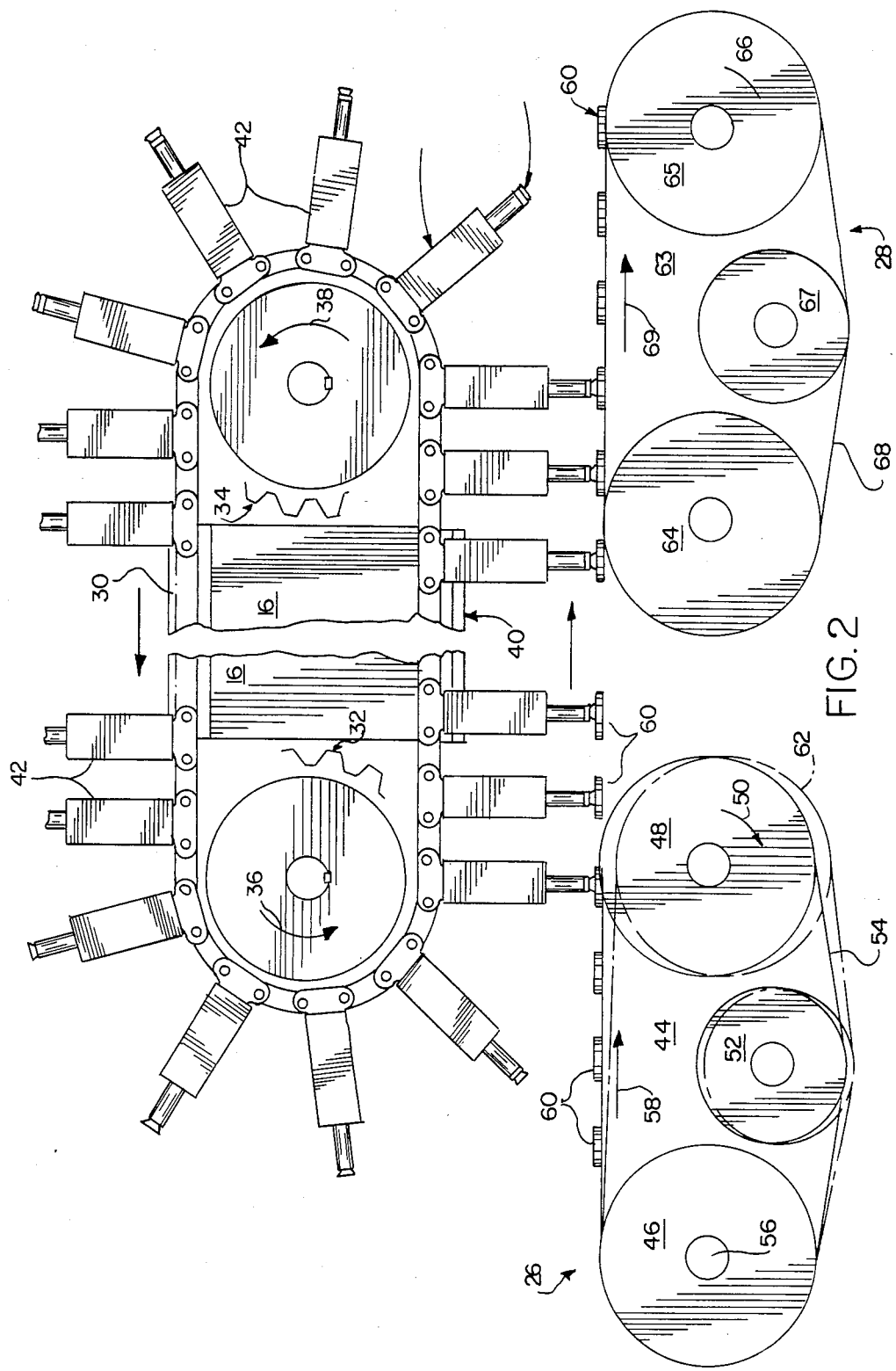
FIG. 2 is a side elevational view of the portions of the system relating to the onloading and offloading of the components.

FIG. 2 illustrates a portion of both the input and output stations in greater detail along with a portion of conveyor 16. As seen in this Figure, conveyor beam 16 has mounted thereon a conveyor chain 30 which is entrained about sprocket wheels 32 and 34 rotating in the arrows indicated by reference numeral 36 and 38 respectively. A chain guide 40 is provided for reasons which will be apparent hereinafter.

Mounted on conveyor chain 30 are a plurality of vacuum gripping devices generally designated by reference numeral 42. Each vacuum gripping device is adapted to grip and retain a single component which it carries through the various processing stations.

Input end or station 26, as illustrated in FIG. 2, includes a base mounting plate 44 upon which are mounted wheels 46 and 48, with wheel 48 being a drive wheel rotating in the direction indicated by arrow 50. An idler/tensioner wheel 52 is provided for a belt 54 entrained about wheels 46, 48 and 52. The entire assembly is pivotable about shaft 56 of wheel 46 while the opposite end is supported by a pneumatic cylinder 59 (FIG. 1). Pneumatic cylinder 59 is adapted to move the end of base plate 44 on which wheel 48 is mounted upward and downwards as shown in outline by reference numeral 62 to bring components 60 into juxtaposition with vacuum devices 42 as will be discussed in greater detail.

At output end 28, there is provided a base plate 63 having wheels 64, 65 and 67 mounted thereon. Wheel 65 is the driven wheel rotating in the direction indicated by arrow 66 while wheel 67 is an idler tensioner wheel. A belt 68 is entrained about wheels 64, 65 and 67 and is thus driven in the direction indicated by arrow 69.

A vacuum gripping device 42 is illustrated in greater detail in FIG. 3 and reference will now be made thereto. Each vacuum gripping device 42 includes a main body 100 which has a passageway extending therethrough, the passageway having an inlet port 106 and an outlet port 108. Mounted in outlet port 108 is a stem 102 which in turn has a passageway 116 extending therethrough and which communicates with outlet port 108. A suction cup 104 is mounted on the tip of stem 102 for ensuring a good seal with component 60 as will be discussed in greater detail hereinafter.

Mounted within the passageway between the inlet and outlet ports 106 and 108 respectively is a valve member having a valve body 118 with sealing 0-rings 120 being mounted thereabout. A check valve plunger 112 is mounted interiorly of valve body 118 and check valve return spring 122 is provided. Spring 122 urges a valve seat 115 to a sealing position against sealing ring 117 to thereby seal the passageway.

Figure 3:
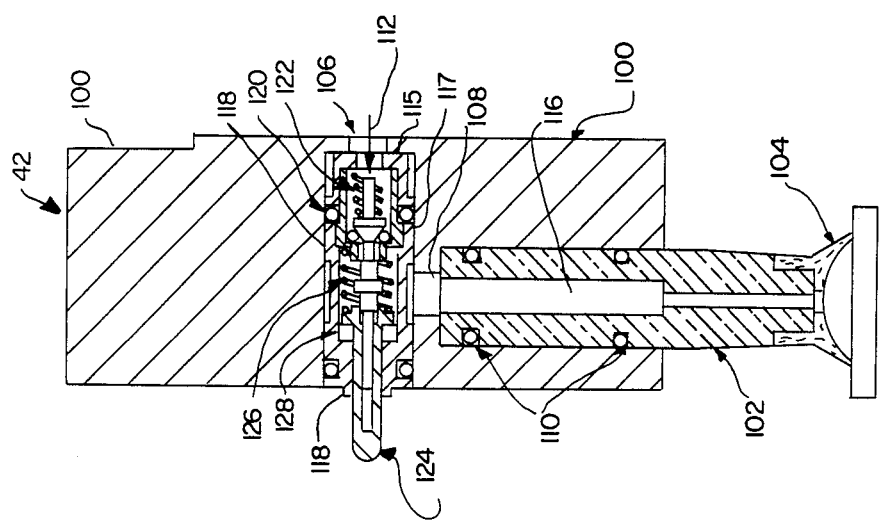
FIG. 3 is a side sectional view of a vacuum gripping device.

There is also provided an activating plunger 124, an activating plunger return spring 126 and sealing 0-rings 128 as shown in FIG. 3. Thus, when plunger 124 is depressed, it opens the check valve and allows free passage of air between inlet and outlet ports 106 and 108 respectively. In operation, when vacuum is applied to inlet port 106, activating plunger 124 is depressed allowing a vacuum to be created within passageway 116 and for part 60 to be retained by the vacuum force created. Subsequently, when plunger 124 is released, plunger 124 is urged outwardly by spring 126 while valve seat 115 is urged towards a sealing position by spring 122. When the vacuum is removed, a vacuum is thus retained or "locked in" within the passageway and component 60 can be carried as desired.

Figure 4:
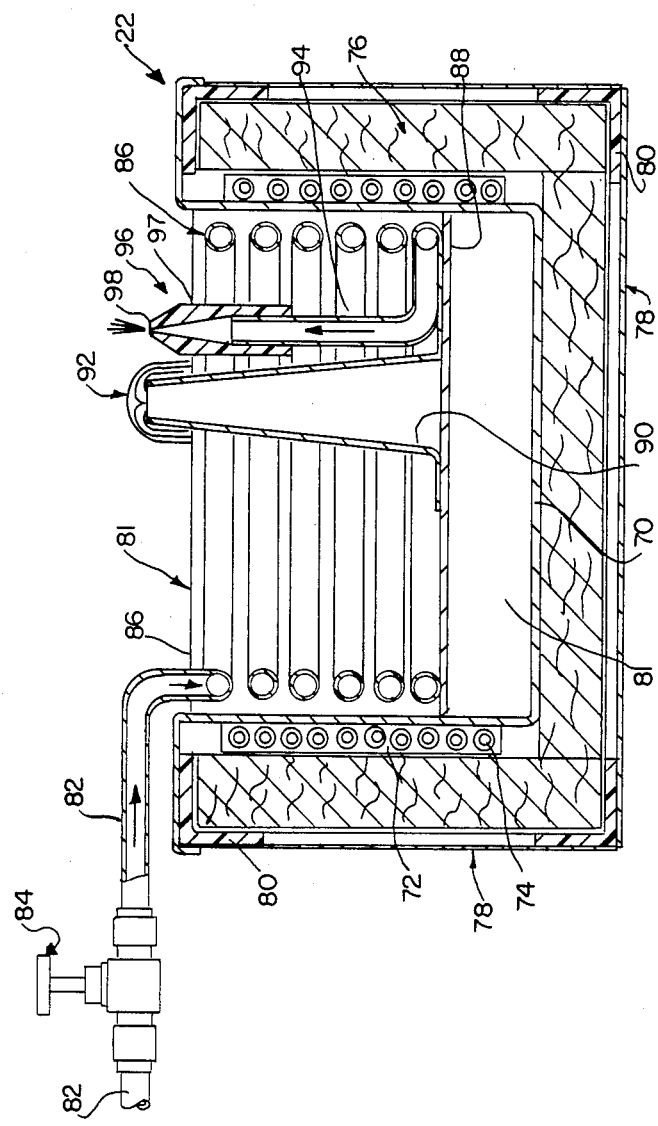
FIG. 4 is a sectional view of the soldering station.

Turning to FIG. 4, a preferred embodiment of the soldering station is illustrated. Thus, soldering station 22 comprises a solder pot which includes an inner shell 70 having a pair of platen heaters 72 on either side. Platen heaters 72 include a heating coil 74 mounted interiorly thereof. About the bottom of the pot and the platen heaters there is provided insulation 76. An outer shell 78 is separated from insulation 76 by means of spacers 80. Interiorly of inner shell 70 is molten solder 81.

A gaseous inlet line 82 has a regulating valve member 84 mounted thereon for controlling the supply of gas flowing through line 82. Tubing 86 is arranged about the interior of the solder pot in a serpentine fashion such that gas flowing through line 82 into tubing 86 travels a sufficient distance to bring the gas interiorly of the tubing to a temperature which is approximately the temperature of the molten solder. The tubing terminates at an upwardly extending air-knife inlet generally designated by reference numeral 94.

A base member 88 in the solder pot supports a chimney 90 through which the molten solder is pumped upwardly by a suitable pump arrangement (not shown). This is a conventional wave solder arrangement as is known in the art whereby the molten solder terminates in a bi-directional wave 92. Mounted immediately adjacent to wave 92 is air-knife 96 which consists of a nozzle having an interior cavity 97 to discharge pressurized gaseous material at slot outlet 98 as illustrated in FIG. 4. Slot outlet 98 is relatively narrow and as previously noted, the chamber 97 is defined by converging walls which terminate at slot exit 98. Immediately at slot exit 98, the converging walls defined in chamber 97 and exit 98 are parallel for a very short distance and preferably for a distance of between 1/32 and ¼". In the illustrated embodiment, nozzle exit 98 is directed substantially vertically and thus perpendicular to the bottom of a component 60. It may be inclined slightly in either direction and preferably would be inclined in a direction towards solder wave 92.

In operation, loader 12 is adapted to bring individual tubes of components into alignment with a slide portion of input accumulator/singulator 26. The parts are released in a synchronized fashion with the timing of vacuum gripping devices 42 mounted on conveyor chain 30. Preferably, the conveyor chain is driven in a stepping motion and as a part is brought into proper position with respect to an individual vacuum gripping device, a signal is given to cylinder 59 to bring the end of plate 44 upwardly to present the part into juxtaposition with tip 104 of the vacuum gripping devices. A suction is then established through inlet vacuum port 106 and when the vacuum is established, a signal causes plunger 124 to be released and the vacuum is "locked in" the interior passageway 116 of stem 102. Cylinder 59 then lowers the end of the assembly to the position shown by dash line 62 and the conveyor is advanced one position to bring the next vacuum gripping device into the desired orientation.

After the part is gripped, it is carried to the desired fluxing and preheating and soldering stations. At the soldering station, the leads/contact points are brought into contact with solder wave 92 and air-knife 96 acts to remove any excess molten solder and to ensure the planarity of the coating. It has been found that the thickness of deposition of the molten solder on certain parts and particularly leadless parts can be controlled by the control of pressure of the gas exiting from the air-knife. It will be noted that air-knife 96 has to be mounted sufficiently close to wave 92 such that the solder preferably does not have a chance to solidify before the action of the air-knife. In practice a distance of between 1/16 and ¼" has been found suitable.

Following passage of the parts through cleaning station 24, a mechanism (not shown) is provided to depress activating plunger 124 and release the vacuum, thereby allowing the components to be deposited on belt 68 whereafter they are transferred to unloading station 14.

It will be understood that changes and modifications may be made to the above-described embodiments without departing from the spirit and scope of the invention. Thus, this invention has been described particularly with respect to surface mount components such as LCCs and PLCCs. However, any components capable of being transported by means of a suitable vacuum gripping device as described herein may equally well be processed using the present invention. Such components could include DIPs, SIPs, various radial and axial leaded devices, etc. In addition, the arrangement of the air-knife may be utilized in other types of transport systems for the components.

I claim:

1. A tinning system for applying a hot solder coating to the leads of electronic components comprising:
   (1) an endless closed loop conveyor having input and output positions;
   (2) a plurality of processing stations intermediate said input and output positions;
   (3) a plurality of vacuum gripping devices mounted on said conveyor, each vacuum gripping device comprising
      (a) a body portion
      (b) an inlet port
      (c) an outlet port
      (d) a passageway extending between said inlet port and said outlet port
      (e) a valve member mounted in said passageway, said valve member being movable between a first open position to permit gas passage between the inlet port and outlet port, and a second closed position to seal said passageway;
   (4) means for feeding individual ones of said electronic components in a synchronized relationship with said vacuum gripping devices to said input position such that when a vacuum gripping device is at said input position, a component is placed proximate said outlet port;
   (5) vacuum creating means mounted in operative relationship to said vacuum gripping devices at said input position to create a vacuum at said inlet port of said vacuum gripping device and means for urging said valve from said first open position when said vacuum is applied to said closed position when said vacuum creating means are removed such that a vacuum is maintained in said passageway to retain said component at said outlet port during transportation through said processing stations.

2. The system of claim 1 further including means at said output position for moving said valve to said open position to thereby release said component.

3. The system of claim 2 further including a transfer belt at said output position for transporting said component to a repackaging station.

4. The system of claim 1 wherein said processing stations include a fluxing station, a preheating station, a solder station, and a cleaning station.

5. The system of claim 1 wherein each of said vacuum gripping devices includes a stem mounted in said inlet port, a passageway within said stem communicating with said body passageway and a flexible tip member mounted on the end of said stem in contact with the component.

6. The system of claim 1 further including step drive means for said conveyor, said feeding means including means for bringing said component into operative relationship with said outlet port to said vacuum gripping means between motions of said step drive means.

7. A tinning system for applying a hot solder coating to surface mount electronic components which have a body with substantially planar top and bottom surfaces with the leads oriented toward the bottom, the system comprising
   (1) an endless closed loop conveyor having input and output positions;
   (2) a plurality of processing stations intermediate said input and output positions including a flux station and a wave solder station;
   (3) vacuum gripping means mounted on said conveyor for carrying parts from said input position to said output position;
   (4) said soldering station including a solder pot, means for establishing a solder wave within said pot of a height sufficient to apply molten solder to said downwardly oriented leads; and
   (5) means for directing a flow of heated gaseous material at said bottom surface and leads immediately following exit of said components from said molten solder wave while said solder is still molten.

8. The system of claim 1 wherein said means comprises a tube having an inlet and an outlet with an air passageway therebetween, said tube being heated by said molten solder, a source of pressurized gaseous material connected to said inlet, and a nozzle at the outlet directed at the bottom surface of said surface mounted components.

9. The system of claim 1 wherein said components are LCC's with said leads being contact points mounted flush with said body.

10. A tinning system for applying a hot solder coating to the leads of electronic components, the system comprising
   (1) an endless closed loop conveyor having input and output positions;
   (2) a plurality of vacuum gripping devices mounted on said conveyor, each vacuum gripping device having a body portion, an inlet and outlet port, a passageway extending between said inlet port and said outlet port;

(3) feeding means for feeding components to said vacuum gripping devices, said feeding means comprising a horizontally rotatable transfer belt, means for placing an individual component on said transfer belt, means for driving said transfer belt to bring said component into substantial vertical alignment with a vacuum gripping device, and means for moving said component upwardly into juxtaposition with said outlet port of said vacuum gripping device.

* * * * *